United States Patent
Yamauchi et al.

(10) Patent No.: US 6,512,692 B2
(45) Date of Patent: Jan. 28, 2003

(54) NONVOLATILE SEMICONDUCTOR STORAGE DEVICE AND TEST METHOD THEREFOR

(75) Inventors: Yoshimitsu Yamauchi, Nabari (JP); Nobuhiko Ito, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/875,142

(22) Filed: Jun. 7, 2001

(65) Prior Publication Data

US 2001/0050861 A1 Dec. 13, 2001

(30) Foreign Application Priority Data

Jun. 13, 2000 (JP) ........................................ 2000-176986

(51) Int. Cl.$^7$ .............................................. G11C 16/04
(52) U.S. Cl. .............................. 365/185.11; 365/185.12; 365/185.26
(58) Field of Search ........................ 365/185.11, 185.13, 365/185.26, 185.12, 185.01

(56) References Cited

U.S. PATENT DOCUMENTS

| | | | | |
|---|---|---|---|---|
| 5,526,307 A | * | 6/1996 | Yiu et al. | 365/185.01 |
| 5,592,415 A | * | 1/1997 | Kato et al. | 365/185.01 |
| 5,818,761 A | * | 10/1998 | Onakado et al. | 365/185.11 |
| 6,097,666 A | | 8/2000 | Sakui et al. | 365/230.06 |
| 6,130,841 A | * | 10/2000 | Tanaka et al. | 365/185.22 |

FOREIGN PATENT DOCUMENTS

| | | |
|---|---|---|
| JP | 10-334699 | 12/1998 |
| JP | 11-162199 | 6/1999 |
| JP | 11-224492 | 8/1999 |

OTHER PUBLICATIONS

Yoshimitsu Yamauchi et al.: "A New Cell Structure for Sub-quarter Micron High Density Flash Memory" VLSI. Research Laboratory, Sharp Corporation, Nara, Japan, IEDM Technical Digest, pp. 269–270, 1995.
ICD 97–21, pp. 37–42, 1997.

\* cited by examiner

Primary Examiner—David Nelms
Assistant Examiner—Thong Le
(74) Attorney, Agent, or Firm—Nixon & Vanderhye P.C.

(57) ABSTRACT

A control signal MBPRG is inputted to individual block decoders that constitute a block decoder section. 37 of an ACT type flash memory. Then, the level of the control signal MBPRG is set to "H" to select all the blocks regardless of the contents of address signals a5 through a13, and one word line WL is selected from all the blocks by the addresses a0 through a4. By thus selecting one word line WL every block that is electrically separated by the select transistor and simultaneously applying a write voltage during the test to the same number of word lines WL as the number of blocks, the possible occurrence of a bad influence exerted on the other memory cells is prevented even when the memory cells in which a write operation during the test has been executed include a memory cell that has a negative threshold voltage.

13 Claims, 13 Drawing Sheets

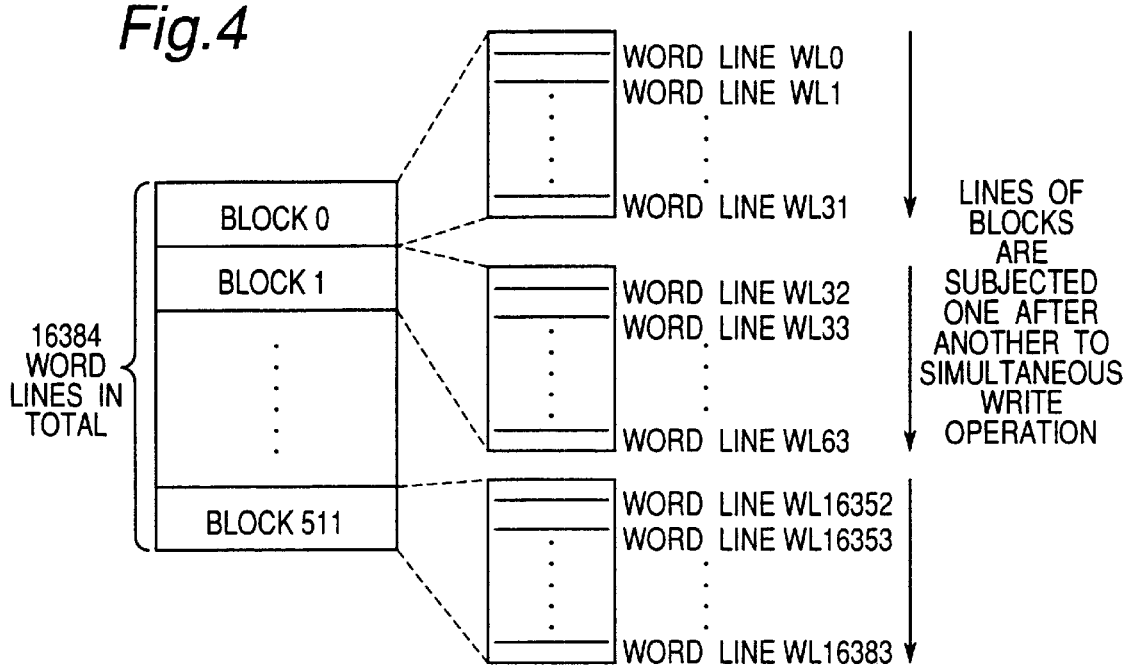
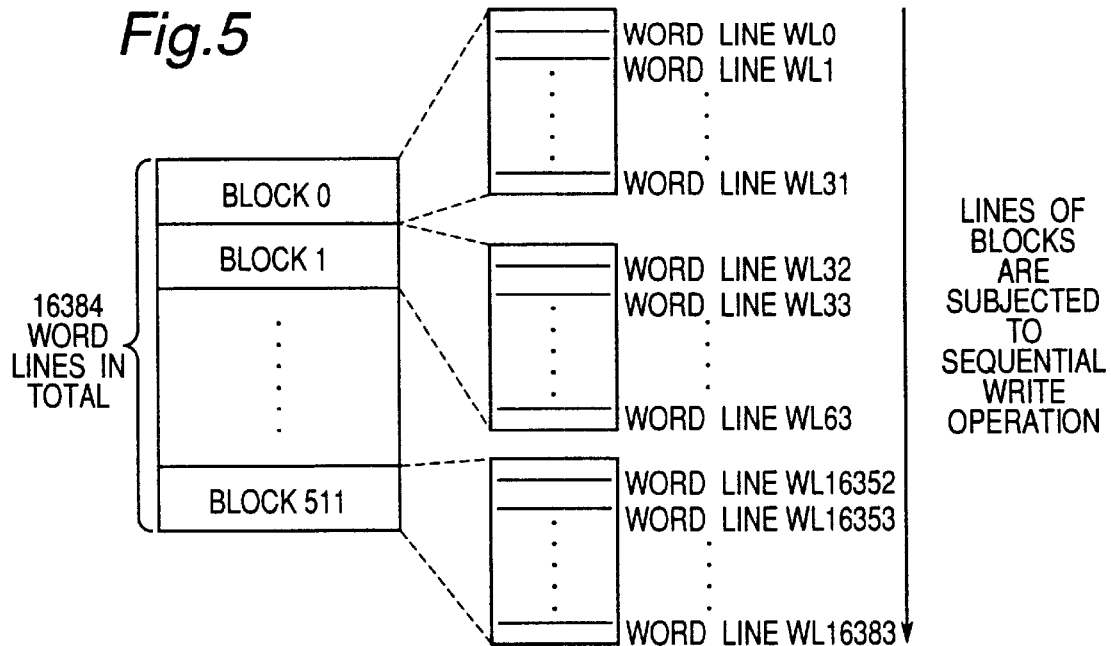

NONVOLATILE SEMICONDUCTOR STORAGE DEVICE AND TEST METHOD THEREFOR

BACKGROUND OF THE INVENTION

The present invention relates to a floating gate type nonvolatile semiconductor storage device and a write test method for the device.

Conventionally, as a virtual ground type flash memory intended for a high integration density, there can be enumerated the ACT (Asymmetrical Contactless Transistor) type flash memory published in, for example, IEDM Technical Digest, pp. 269–270, 1995 "A New cell Structure for Subquarter Micron High Density Flash Memory" and the Transactions of the Institute of Electronics, Information, and Communication Engineers, ICD 97–21, P37, 1997 "Examination of ACT Type Flash Memory Sense System".

This ACT type flash memory utilizes the FN (Fowler-Nordheim) tunneling phenomenon for the write (programming)/erase (erasing) operation and is expected to be used as a data storage type. FIG. 8 is a block diagram of the ACT type flash memory. The ACT type flash memory will be described below with reference to FIG. 8.

In FIG. 8 where the ACT type flash memory cells are arranged in an array form, there are shown a main bit line MBL formed of a metal layer, a sub-bit line SBL formed of a diffusion layer, a word line WL and a select gate signal line SG. The sign ■ indicates a metal-to-diffusion-layer contact, while the sign ● indicates a diffusion layer connection.

As described above, the ACT type flash memory having the above-mentioned construction utilizes the FN tunneling phenomenon for the write and erase operations, and the array construction is provided in the form of a virtual ground array mechanism where an identical bit line is shared by two memory cells. As described above, in the ACT type flash memory, the number of contacts is reduced by sharing the two bit lines MBL and SBL by the memory cells and forming part of the bit line of a diffusion layer, enabling the achievement of high density integration with a considerably reduced array area.

FIGS. 9 through 11 show the voltage application state during the read operation/write operation/erase operation in the ACT type flash memory. The read operation/write operation/erase operation of the ACT type flash memory will be described in detail below with reference to FIGS. 9 through 11.

As shown in FIG. 9, in the read operation, a voltage of 0 V is applied to adjoining three main bit lines MBL0, MBL1 and MBL2. Two main bit lines MBL3 and MBL4, which are further adjacent to the main bit line MBL2, are precharged with 1 V and thereafter put into a floating state. A voltage of 1 V is applied to one main bit line MBL5 that is further adjacent to the main bit line MBL4. Two main bit lines MBL6 and MBL7, which are further adjacent to the main bit line MBL5, are precharged with 1 V and thereafter put into the floating state. Then, the voltage application pattern of the eight main bit lines MBL of the main bit lines MBL0 through MBL7 will be repeated subsequent to the main bit line MBL8.

In the above case, a potential difference of 1 V is generated between the source and the drain of ACT type flash memory cells 1 and 1 enclosed by the sign ○ in FIG. 9. Therefore, if the threshold voltage of the ACT type flash memory cells 1 and 1 is lower than the voltage (3 V) of the word line WL0, then a cell current flows, as a consequence of which the drain voltage is lowered. If the threshold voltage of the ACT type flash memory cells 1 and 1 is higher than the voltage (3 V) of the word line WL0, then no cell current flows, as a consequence of which the drain voltage is not lowered. Accordingly, by sensing the difference in the drain voltage by means of a sense amplifier (not shown) via the main bit lines MBL3 and MBL7 with a voltage of 3 V applied to the select gate signal line SG, the information written in the ACT type flash memory cells 1 and 1 is read.

In the write operation, as shown in FIG. 10, a high voltage of 5 V is applied to the n$^+$ side of the sub bit lines (diffusion bit lines) SBL2 and SBL5 of the ACT type flash memory cells 2 and 2 to undergo the write operation in a state in which a negative voltage of −8 V is applied to the word line WL0. In the above case, electrons are to be extracted from the floating gates of the ACT type flash memory cells 2 and 2 toward the sub bit lines SBL2 and SBL5 by the FN tunneling phenomenon, as a consequence of which the threshold voltage of the ACT type flash memory cells 2 and 2 is lowered. In general, the threshold voltage of the ACT type flash memory cells 2 and 2 is controlled to about 1 V to 2 V by the write operation.

In the erase operation, as shown in FIG. 11, a voltage of −8 V is applied to the sub-bit line SBL in a state in which a high voltage of 10 V is applied to the word lines WL0 through WL31 inside one block to undergo the erase operation demarcated by the select gate signal line SG, and a voltage of −8 V is applied to the substrate of the ACT type flash memory cell. In this case, electrons are to be injected from the substrate (channel region) of each ACT type flash memory cell inside one block to undergo the erase operation toward the floating gate by the FN tunneling phenomenon, as a consequence of which the threshold voltage of each ACT type flash memory cell is raised. In general, the threshold voltage of each ACT type flash memory cell is controlled to about 4 V to 6 V by the erase operation.

In the case of FIG. 11, a voltage of 0 V is applied to the select gate signal lines SG0 and SG0, and a voltage of −8 V is applied to the select gate signal lines SG1 and SG1, consequently turning on select transistors 3 and 4 whose gates are connected to the select gate signal lines SG0 and SG0. Therefore, a block 0 is selected, and all the ACT type flash memory cells inside the block 0 are erased in a batch. In the above case, the sources and the drains of all the ACT type flash memory cells in the non-selected state, which are put into a high impedance state, are not erased.

As the row decoder circuit of the present ACT type flash memory, there is the following one as shown in FIG. 12. This row decoder circuit 11 is constructed roughly of a driver section 12 for outputting various voltages to the word line WL, a control voltage circuit section 13, a selecting voltage circuit section 14, a non-selecting voltage circuit section 15, a predecoder section 16 and a block decoder section 17.

FIG. 13 shows a circuit diagram of a control voltage circuit 0 that constitutes the control voltage circuit section 13. This control voltage circuit is a circuit for outputting a control signal for turning on and off a P-channel MOS (Metal Oxide Semiconductor) transistor and an N-channel MOS transistor that constitute the driver section 12 of the row decoder 11. Then, output signals hrda0 and hrdab0 are generated by inputting an input signal pre0 (an output signal of a predecoder 0). The input signals other than the input signal pre0 and the power source are common to each control voltage circuit.

FIG. 14 shows a circuit diagram of a selecting voltage circuit 0 that constitutes the selecting voltage circuit section 14. This selected voltage circuit outputs an application voltage to be applied to the selected word line WL via the driver section 12. Then, an output signal hhvx0 is generated by inputting an input signal se10 (an output signal of a block decoder 0). The input signals other than the input signal se10 and the power source are common to each selecting voltage circuit.

FIG. 15 shows a circuit diagram of the non-selecting voltage circuit 0 that constitutes the non-selecting voltage circuit section 15. This non-selected voltage circuit outputs an application voltage to be applied to the non-selected word line WL via the driver section 12. Then, an output signal hnn0 is generated by inputting an input signal se10 (the output signal of the block decoder 0). The input signals other than the input signal se10 and the power source are common to each non-selecting voltage circuit.

FIG. 16 shows a circuit diagram of the predecoder 0 that constitutes the predecoder section 16. FIG. 17 shows a circuit diagram of the block decoder 0 that constitutes the block decoder section 17.

A word line decoding method during the write operation will be described below with reference to FIG. 12. First of all, one block (including 32 word lines WL) is selected from 512 blocks by address signals a5 through a13. Then, the selected block of the driver section 12 is supplied with a write voltage hhvx by the selecting voltage circuit of the selecting voltage circuit section 14 and a voltage of 0 V by the non-selecting voltage circuit of the non-selecting voltage circuit section 15. In contrast to this, the non-selected block of the driver section 12 is supplied with a voltage of 0 V by the selecting voltage circuit of the selecting voltage circuit section 14 and the non-selecting voltage circuit of the non-selecting voltage circuit section 15.

Then, a write voltage is applied only to one word line WL among the 32 word lines WL of the selected block by select signals hrda and hrdab from one control voltage circuit of the control voltage circuit section 13 selected by decoding the address signals a0 through a4 by the predecoder 16. On the other hand, the voltage of 0 V supplied by the non-selecting voltage circuit of the non-selecting voltage circuit section 15 is applied to the remaining word lines WL of the same selected block.

The voltage of 0 V is supplied by the selecting voltage circuit and the non-selecting voltage circuit regardless of the selection/non-selection of the predecoder of the predecoder section 16, and therefore, the voltage of 0 V is to be applied to all the word lines WL.

There are the methods disclosed in Japanese Patent Laid-Open Publication No. HEI 11-224492 and Japanese Patent Laid-Open Publication No. HEI 11-162199 as a test time reducing method for the aforementioned floating gate type nonvolatile semiconductor storage device. According to the former method, by simultaneously selecting a plurality of blocks, the data of the memory cells inside the plurality of blocks are simultaneously subjected to the erase, write and test operations. According to the latter method, a plurality of word lines is enabled by a group of signals for simultaneously driving $2^n$ (n: positive integer) word lines.

However, the write test methods of the aforementioned conventional floating gate type nonvolatile semiconductor storage device have the following problems. That is, according to the ACT type flash memory as shown in FIG. 8, if a memory cell whose threshold voltage is negative (Vt<0 V) exists in the selected block as shown in FIG. 18, then the memory cell M0 is to be turned on even when the word line WL0 has a voltage of 0 V. Therefore, it is impossible to measure the threshold voltage of memory cells M1 through M63 that share the sub-bit lines SBL1 and SBL2 with the memory cell M0.

The above matter will be described in more detail below. Reference is first made to the write operation during the write test. It is herein assumed that the memory cell M0 is selected and subjected to the write operation. A voltage of "H" level (5 V, for example) is applied to the select gate signal lines SG0 and SG0 to turn on select transistors 21 and 22. Then, a negative high voltage (−8 V, for example) is applied to the word line WL0 to which the control gate of the memory cell M0 is connected. A positive voltage (5 V, for example) is applied to the main bit line MBL2 connected to the drain side, and the main bit line MBL1 connected to the source side is put into the floating state (high impedance state).

Further, the main bit line MBL connected to the drain side of other non-selected memory cells M is put in the floating state. The substrate (or p-well) is set to a reference voltage (0 V, for example). It is to be noted that a voltage of 0 V is applied to the word lines WL1 through WL63 connected to the control gates of the non-selected memory cells M.

With this arrangement, the FN tunneling phenomenon occurs between the drain side and the floating gate of the memory cell M0 to undergo the write operation, extracting electrons from the floating gate to the drain side via the tunnel oxide film, and consequently the threshold voltage of the memory cell M0 is lowered. The memory cell M0 is thus put into the write state (in which the threshold voltage becomes 2 V or higher). The write is executed by successively executing the aforementioned write operation in the memory cells M.

Subsequently, when executing the test, the read operation is executed after the aforementioned write operation is executed, and the threshold voltage of the memory cell M0 that has undergone the write operation is measured. If the threshold voltage is not lower than a specified voltage, then the write operation is further executed in the memory cell M0. However, depending on the memory cell M, there is a certain cell whose threshold voltage is very rapidly lowered due to characteristic variations. Therefore, it is sometimes the case where the threshold voltage of the memory cell M that has already put in the write state is 0 V or lower when measuring the threshold voltage.

Moreover, since the threshold voltage of the memory cell M has been not lower than a specified voltage value when measuring the threshold voltage, it is sometimes the case where the threshold voltage of the memory cell M might disadvantageously become 0 V or lower when the write operation is executed again.

Particularly, when the operating voltage of the nonvolatile semiconductor storage device is lowered (for example, the power voltage is 3 V or 1.8 V), the threshold voltage in the write state is required to be lowered. Therefore, the aforementioned situation, which has not occurred up to now, emerges as a problem.

That is, in the case where the threshold voltage of the memory cell M0 becomes 0 V or lower as described above, the following troubles occur when testing the memory cells M other than the memory cell M0. The test operation (read operation) of the memory cells M will be described below. In this case, it is assumed that the memory cell M1 is selected and subjected to the test in FIG. 18.

A voltage of "H level (3 V, for example)" is applied to the select gate signal lines SG0 and SG0 to turn on the select transistors 21 and 22. Then, a voltage of 3 V is applied to the word line WL1 to which the control gate of the memory cell M1 is connected. On the other hand, a voltage of 0 V is applied to the non-selected word lines WL0 and WL2 through WL63. Further, a reference voltage (0 V, for example) is applied to the main bit line MBL1 connected to the source side of the memory cell M1, and a precharge voltage of 1 V is applied to the main bit line MBL2 connected to the drain side. The substrate (or p-well) is set to a reference voltage (0 V, for example).

With this arrangement, when the memory cell M1 to be read is in the erase state, no cell current flows since the threshold voltage is not lower than 4 V. Therefore, the voltage of 1 V precharged by the main bit line MBL2 is maintained. When the memory cell M1 is in the write state, a cell current flows since the threshold voltage is not higher than 2 V. Consequently, the voltage of 1 V precharged by the main bit line MBL2 is lowered to a voltage of 0 V. Then, by sensing this precharge voltage by means of the sense amplifier (not shown) connected to the end of the main bit line MBL, the state of the memory cell M1 is determined.

Assuming that the memory cell M0 is in an excessive write state (in which the threshold voltage is negative: overprogramed state) as described above, then a cell current is to flow through the memory cell M0 when a voltage of 0 V is applied to put the word line WL0 into the non-selected state. Therefore, if the transition of the precharge voltage is determined by the main bit line MBL2, then the precharge voltage of the main bit line MBL2 is lowered regardless of the state of the memory cell M1 subjected to the test. Therefore, the state of the memory cell M1 cannot correctly be determined. The same phenomenon also occurs in the memory cells M2 through M63 of which the drain side is connected to the main bit line MBL2.

That is, according to the Japanese Patent Laid-Open Publication No. HEI 11-224492, the test operation (read operation) is simultaneously executed inside the arbitrary block. Therefore, when at least one memory cell whose threshold voltage has become negative exists, the threshold voltage of the memory cells M1 through M63 that share the sub-bit lines SBL1 and SBL2 with the memory cell M0 cannot be measured as described above, and this leads to the problem that the write test is consequently not normally executed.

According to the Japanese Patent Laid-Open Publication No. HEI 11-162199, the test operation (read operation) is executed by simultaneously selecting $2^n$ word lines. Therefore, in the case where a plurality of word lines are selected inside an identical block, the test cannot normally be executed likewise when at least one memory cell whose threshold voltage has become negative exists.

Furthermore, a "logic gate" is added so as to enable the switching between the simultaneous selection of all the word lines and the stripe pattern selection for simultaneously selecting the odd-number or even-number word lines in a test mode. However, because of the OR gate, the word line to which the test signal is inputted is to be selected, and a plurality of word lines are selected inside an identical block. Therefore, in the case where the word lines having only the memory cells in which the write operation has normally been executed and the word lines including the memory cells in which the write operation has not normally been executed are existing in mixture inside an identical block, the write voltage is to be applied again to the memory cells in which the write operation has normally been executed when the write operation is executed again in the memory cell in which the write operation is not normally executed. As a result, there is the problem that the unnecessary write voltage is applied to the memory cell in which the write operation has normally been executed.

SUMMARY OF THE INVENTION

Accordingly, the object of the present invention is to provide a nonvolatile semiconductor storage device capable of executing the write test so that a plurality of word lines are not selected inside an identical block and a test method for the device.

In order to achieve the above object, there is provided a nonvolatile semiconductor storage device including floating gate field-effect transistors that are provided with a control gate, a floating gate, a drain and a source, able to electrically write and erase information and arranged in a matrix form on a substrate or a well and including a plurality of row lines connected to the control gates of the floating gate field-effect transistors arranged in a direction of row, the device comprising:

a block switching means for dividing the row lines into blocks every several lines and connecting a plurality of first column lines connected to the drains and sources of the floating gate field-effect transistors arranged in a direction of column in each block to a second column line arranged commonly to all the blocks;

block selecting means for selecting any one of the plurality of blocks;

a row line selecting means for selecting any one of the plurality of row lines inside the selected block; and an all blocks selecting means, provided for the block selecting means, for selecting all the blocks on the basis of a first control signal.

According to the above construction, in the write operation during the test, all the blocks are selected by the all blocks selecting means of the block selecting means and one row line in every block is selected by the row line selecting means, simultaneously applying the write voltage to the row lines selected one after another from all the blocks. Then, in measuring the threshold voltage, the block switching means is turned off to electrically separate the non-measured blocks from the measured block. Therefore, even if a floating gate field-effect transistor in which the threshold voltage is negative exists in a certain block, the bad influence exerted by the floating gate field-effect transistor when measuring the floating gate field-effect transistors of other blocks is eliminated.

In one embodiment of the present invention, the nonvolatile semiconductor storage device comprises:

a selection preventing means, provided for the block selecting means, for preventing a subsequent selecting operation of a block currently selected by an address signal on the basis of a second control signal.

According to the above construction, when the threshold voltages of all the floating gate field-effect transistors connected to the selected row of the currently selected block by the address signal are normal in measuring the threshold voltage during the test, the subsequent selecting operation to the selected block is prevented by the selection preventing means. Thus, an excessive stress is prevented from being applied to the floating gate field-effect transistors, which exist in the block and in which the threshold voltages are normal, is prevented, when the write operation is executed again in the floating gate field-effect transistors of other blocks.

In one embodiment of the present invention, the nonvolatile semiconductor storage device comprises:

a resetting means, provided for the block selecting means, for setting the state of selection by the all blocks selecting means back into an initial state on the basis of a third control signal.

According to the above construction, when the write, threshold voltage measurement and rewrite operations of the floating gate field-effect transistors connected to the row lines selected one after another from all the blocks are ended, the selective state set by the all blocks selecting means is set back to the initial state by the resetting means. Thus, the block selection when, for example, erasing the floating gate field-effect transistors that have undergone the write test is accurately executed.

Also, there is provided a method for testing a nonvolatile semiconductor storage device including floating gate field-effect transistors that are provided with a control gate, a floating gate, a drain and a source, able to electrically write and erase information and arranged in a matrix form on a substrate or a well, including a plurality of row lines connected to the control gates of the floating gate field-effect transistors arranged in a direction of row and including a block switching means for connecting a plurality of first column lines connected to the drains and sources of the floating gate field-effect transistors arranged in a direction of column inside each of blocks constructed by dividing the row lines every several lines to a second column line arranged commonly to all the blocks, the method comprising the steps of:

selecting one after another the row lines from all the blocks divided by the block switching means and simultaneously applying a write voltage to the selected row lines during a write test.

According to the above construction, during the write test, the write voltage is simultaneously applied to the row lines selected one after another from all the blocks. Then, in measuring the threshold voltage, the block switching means is turned off to electrically separate the non-measured block from the measured block. Therefore, even if a floating gate field-effect transistor in which the threshold voltage is negative exists in a certain block, the bad influence exerted by the floating gate field-effect transistor when measuring the floating gate field-effect transistors of other blocks is eliminated.

Furthermore, the erase voltage is applied only to the row line relevant to the memory cell that is required to be subjected to the erase operation, and therefore, the threshold voltage can be prevented from being raised by the repetitive application of the erase voltage to the memory cells every erase operation. This may produce remarkable effects on the memory cells that will be manufactured by finer processing in the future.

Furthermore, all the memory cells are erased in a batch, and therefore, the erase time can be shortened.

Also, there is provided a method for testing a nonvolatile semiconductor storage device including floating gate field-effect transistors that are provided with a control gate, a floating gate, a drain and a source, able to electrically write and erase information and arranged in a matrix form on a substrate or a well, including a plurality of row lines connected to the control gates of the floating gate field-effect transistors arranged in a direction of row and including a block switching means for connecting a plurality of first column lines connected to the drains and sources of the floating gate field-effect transistors arranged in a direction of column inside each of blocks constructed by dividing the row lines every several lines to a second column line arranged commonly to all the blocks, the method comprising the steps of:

selecting one after another the row lines from an arbitrary block of the blocks divided by the block switching means and simultaneously applying a write voltage to the selected row line during a write test.

According to the above construction, during the write test, the write voltage is simultaneously applied to the row lines selected one after another from arbitrary blocks. Then, in measuring the threshold voltage, the block switching means is turned off to electrically separate the non-measured block from the measured block. Therefore, even if a floating gate field-effect transistor in which the threshold voltage is negative exists in a certain block, the bad influence exerted by the floating gate field-effect transistor when measuring the floating gate field-effect transistors of other blocks is eliminated.

In one embodiment of the present invention, the row line connected to only the floating gate field-effect transistor in which the write operation has normally been executed is not selected when the write operation is executed again in the floating gate field-effect transistor in which the write operation has not normally been executed.

According to the above construction, the row line connected to only the floating gate field-effect transistor in which the write operation has normally been executed is not selected when the write operation is executed again in the floating gate field-effect transistor in which the write operation has not normally been executed. Thus, the floating gate field-effect transistors in which the threshold voltages are normal are prevented from being applied by an excessive stress when the write operation is executed again.

In one embodiment of the present invention, an erase voltage is applied to the selected row line of each block after write, threshold voltage measurement and rewrite operations of all the floating gate field-effect transistors connected to one row line selected from each block are ended.

According to the above construction, the erase voltage is applied to the row line in which the write, threshold voltage measurement and rewrite operations have been ended. Thus, the bad influence exerted by the floating gate field-effect transistor having undergone the write test on the other floating gate field-effect transistor undergoing the subsequent write test is prevented.

In one embodiment of the present invention, an erase voltage is applied to all the row lines of all the blocks after write, threshold voltage measurement and rewrite operations of all the floating gate field-effect transistors connected to one row line selected from each block are ended.

According to the above construction, every time the write, threshold voltage measurement and rewrite operations of the selected row line are ended, the erase voltage is applied to all the row lines of all the blocks. Thus, the bad influence exerted by the floating gate field-effect transistor having undergone the write test on the other floating gate field-effect transistor undergoing the subsequent write test is reliably prevented.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 4 is a diagram showing a state in which each word line is selected when the write operation is executed simultaneously during the test on one word line selected from each of all the blocks;

FIG. 5 is a diagram showing a state in which each word line is selected when a write operation is executed during the test in a conventional ACT type flash memory;

DETAILED DESCRIPTION OF THE PREFERRED EMBODIMENTS

Figure 1:
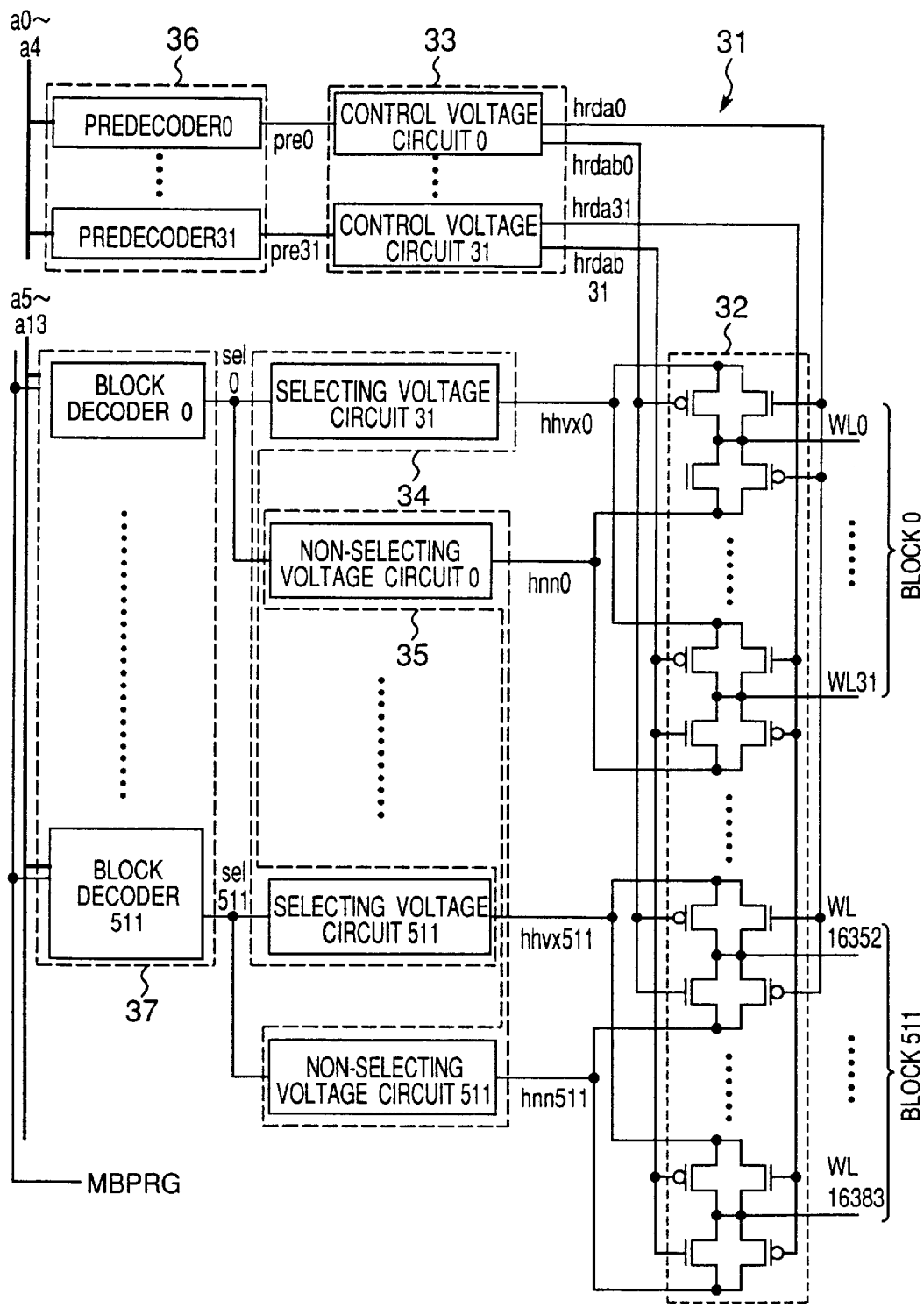
FIG. 1 is a block diagram of a row decoder circuit applied to a nonvolatile semiconductor storage device of the present invention.

The present invention will be described in detail below on the basis of the embodiments thereof shown in the drawings.

(First Embodiment)

Figure 3:
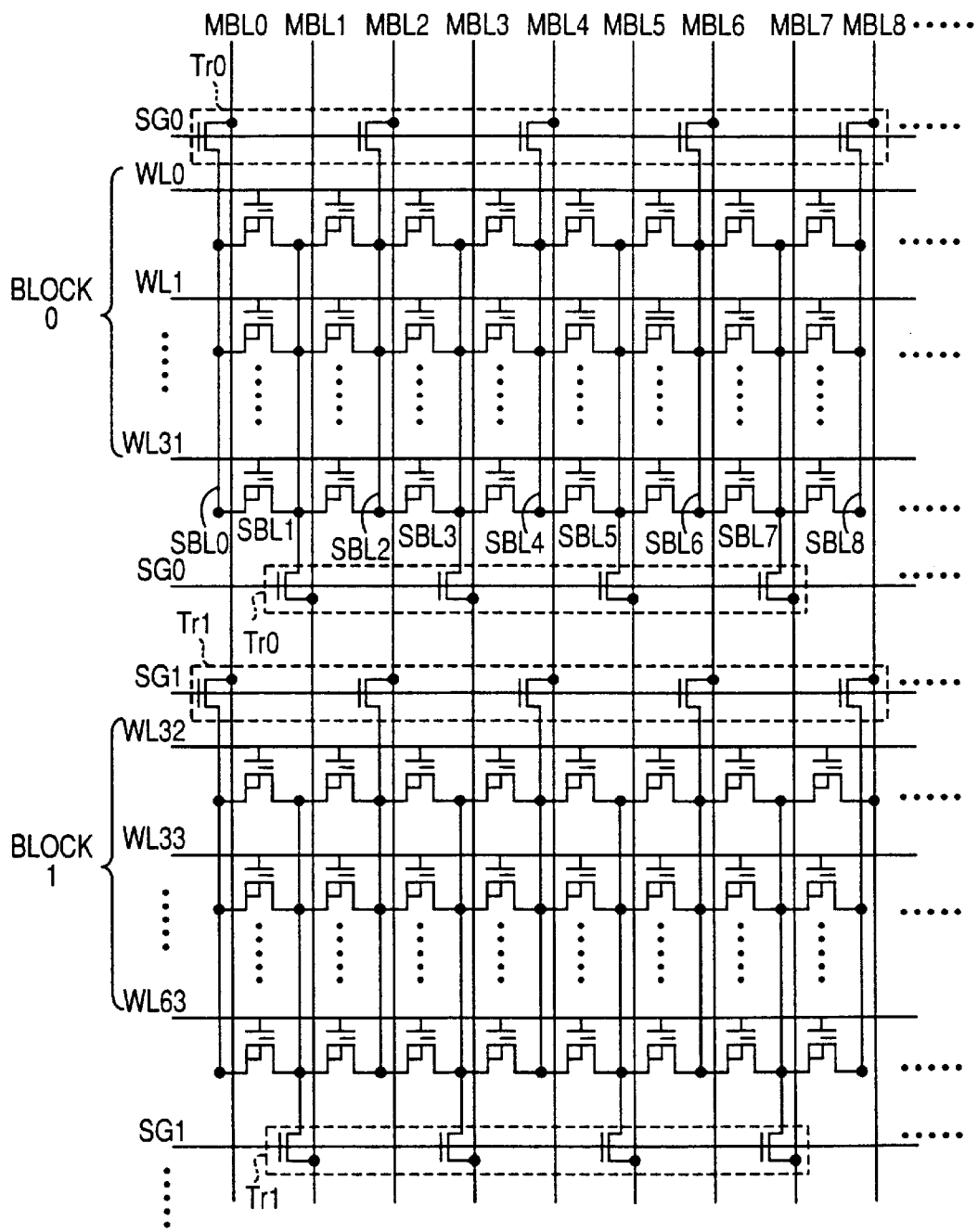
FIG. 3 is a diagram showing the array structure of an ACT type flash memory that serves as a nonvolatile semiconductor storage device of the present invention.

FIG. 1 is a block diagram of a row decoder circuit applied to the nonvolatile semiconductor storage device of the present embodiment. Prior to the description of this row decoder circuit, an ACT type flash memory constructed of a virtual ground type array that is a nonvolatile semiconductor storage device to which this row decoder circuit is applied will be described first. FIG. 3 shows the array structure of the present ACT type flash memory. It is to be noted that the array structure itself of this ACT type flash memory has conventionally been used.

In FIG. 3, word lines WL are segmented in blocks (the number of blocks: k) of WL32k, WL(32k+1), . . . WL(32k+31) (k=0, 1, 2, 3, . . . ) by a select transistor Trk that serves as the aforementioned block switching means, and the blocks are made electrically separable by the select transistor Trk.

Then, by making the gate control signal SG0 of select transistors Tr0 have, for example, "H" level, the select transistors Tr0 are put into the ON state, and the sources and drains of all the memory cells M in a block 0 are connected to main bit lines MBLj (MBL0, MBL1, . . . ) via sub-bit lines SBLj (SBL0, SBL1, . . . ) and the select transistors Tr0.

On the other hand, select transistors Tr1 are in the OFF state when, for example, a gate control signal SG1 of the select transistors Tr1 has "L" level, and therefore, the sources and drains of all the memory cells M in a block 1 are electrically disconnected from the main bit lines MBLj (MBL0, MBL1 . . . ). It is to be noted that other portions are the same as those described in connection with the prior art, and therefore, no description is provided for them.

The row decoder circuit shown in FIG. 1 is a circuit for driving the word line WL segmented in blocks. This row decoder circuit 31 is constructed of a driver section 32 for outputting various voltages to the word line WL, a control voltage circuit section 33, a selecting voltage circuit section 34, a non-selecting voltage circuit section 35, a predecoder section 36 and a block decoder section 37.

Figure 12:
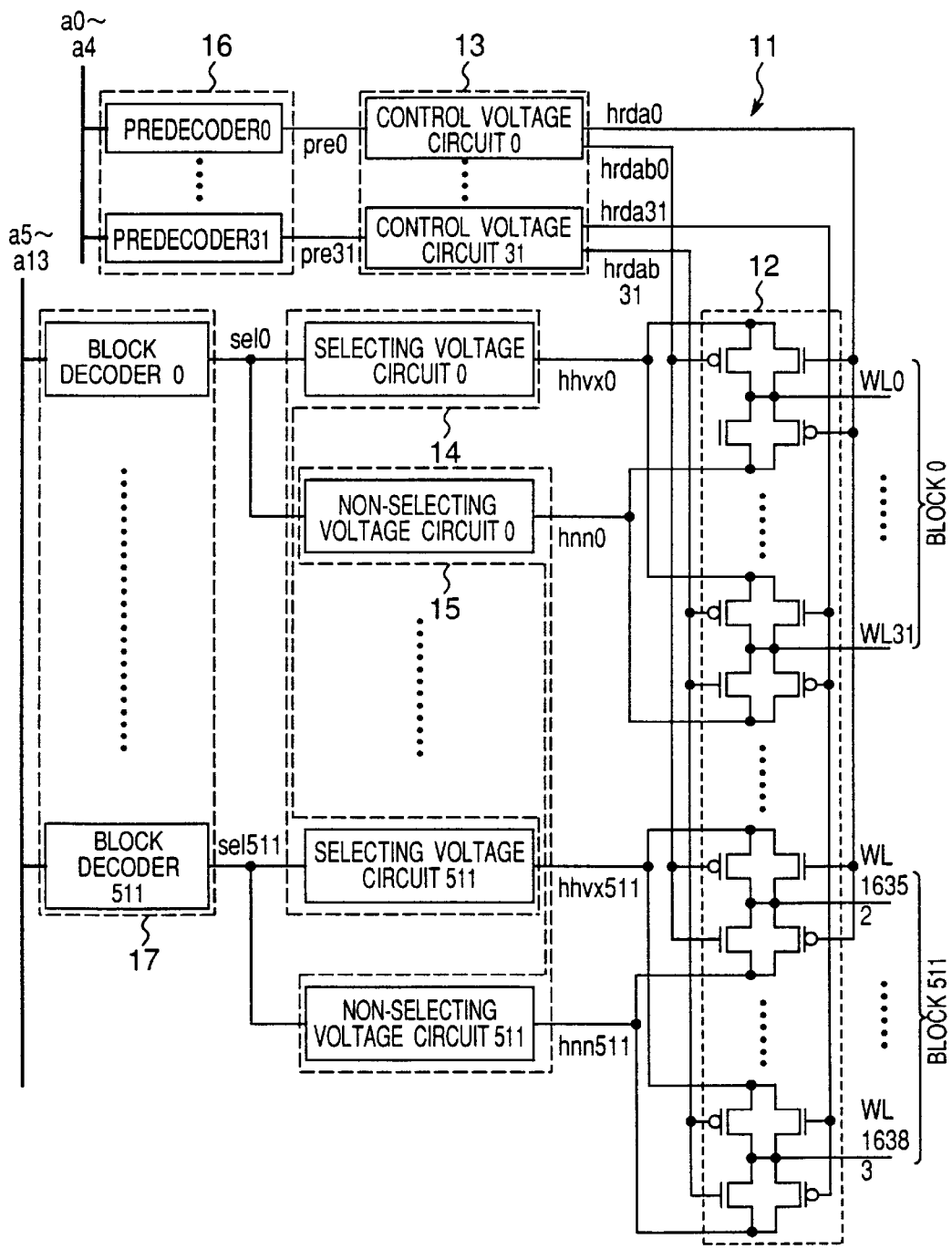
FIG. 12 is a block diagram of a row decoder circuit applied to the ACT type flash memory shown in FIG. 8.

With regard to the present row decoder circuit 31, a control signal MBPRG is inputted to individual block decoders that constitute the block decoder section 37, and this row decoder circuit differs from the conventional row decoder circuit 11 shown in FIG. 12 in that the operation of the block decoders is controlled by the control signal MBPRG. It is to be noted that the control voltage circuits that constitute the driver section 32 and the control voltage circuit section 33, the selecting voltage circuits that constitute the selecting voltage circuit section 34, the non-selecting voltage circuits that constitute the non-selecting voltage circuit section 35 and the predecoders that constitute the predecoder section 36 have the same construction and operations as those of the conventional row decoder circuit 11 shown in FIG. 12.

Figure 2:
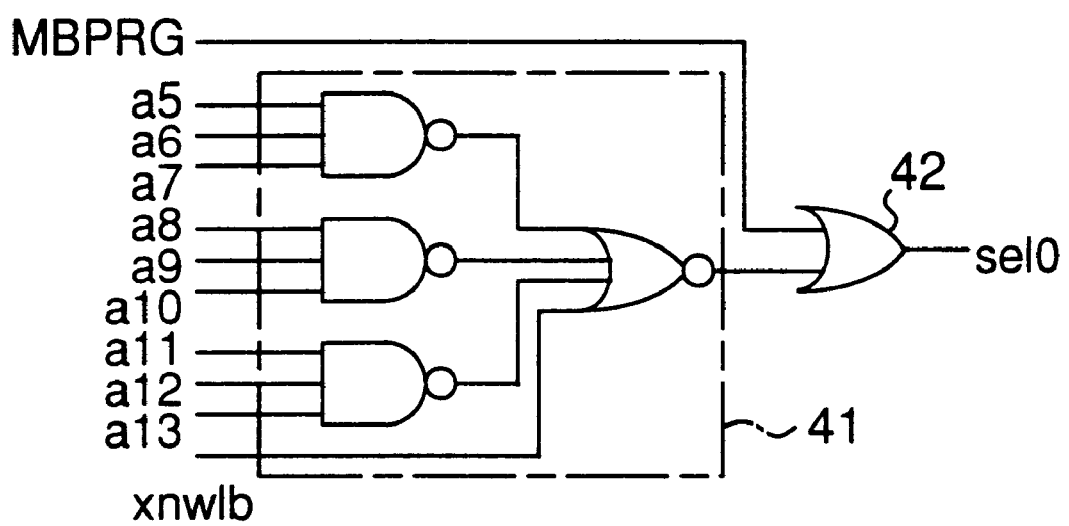
FIG. 2 is a circuit diagram of a block decoder in FIG. 1.
Figure 17:
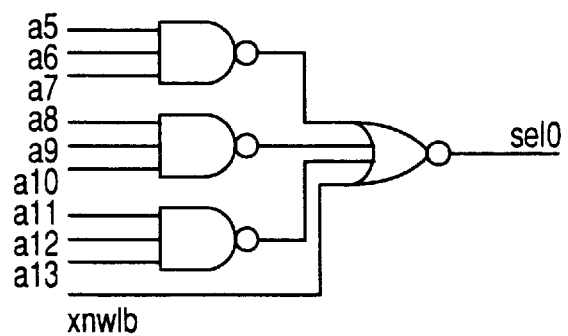
FIG. 17 is a circuit diagram of a block decoder in FIG. 12.

FIG. 2 shows a circuit diagram of a block decoder 0 that constitutes the block decoder section 37. As shown in FIG. 2, the block decoder 0 of the present embodiment has the same circuit construction as that of the conventional block decoder shown in FIG. 17 and further includes an OR gate 42 added to the select signal generating circuit 41 for generating a select signal. Then, this OR gate 42 receives an output signal of the select signal generating circuit 41 as an input to one input terminal thereof and receives the control signal MBPRG as an input to the other input terminal thereof, consequently outputting a signal se10, which is an input signal to the selecting voltage circuit 0 and the non-selecting voltage circuit 0.

Then, as shown in FIG. 1, the control signal MBPRG is inputted commonly to all the block decoders 0 through 511 in the present embodiment. Therefore, by making this control signal MBPRG have "H" level, all the blocks can be selected regardless of the contents of address signals a5 through a13 for selecting the blocks. That is, the all blocks selecting means is constructed of the OR gate 42 in the present embodiment.

The write operation during the test of the row decoder circuit 31 in the memory cell will be described below with reference to FIG. 1. First of all, in FIG. 2, the control signal MBPRG of the block decoder 0 comes to have "H" level (note that the control signal MBPRG is made to have "L" level during the normal write operation). By this operation, the output signal se10 comes to have "H" level regardless of the contents of the address signals a5 through a13. The block decoders 1 through 511 have the same circuit construction and differ only in, for example, the address signals to be inputted being inverted such as /a5 in order to specify a block position. Accordingly, the output signals sel1 through sel511 similarly come to have "H" level since the commonly inputted control signal MBPRG has "H" level.

Figure 13:
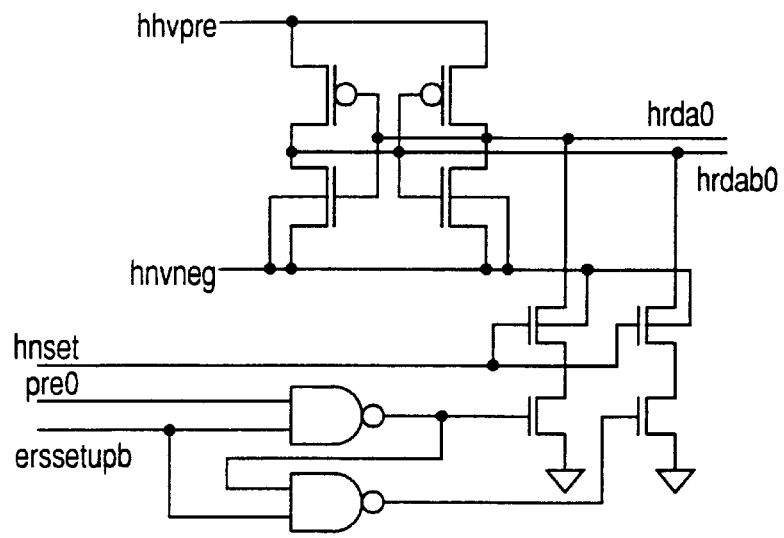
FIG. 13 is a circuit diagram of a control voltage circuit in FIG. 12.
Figure 14:
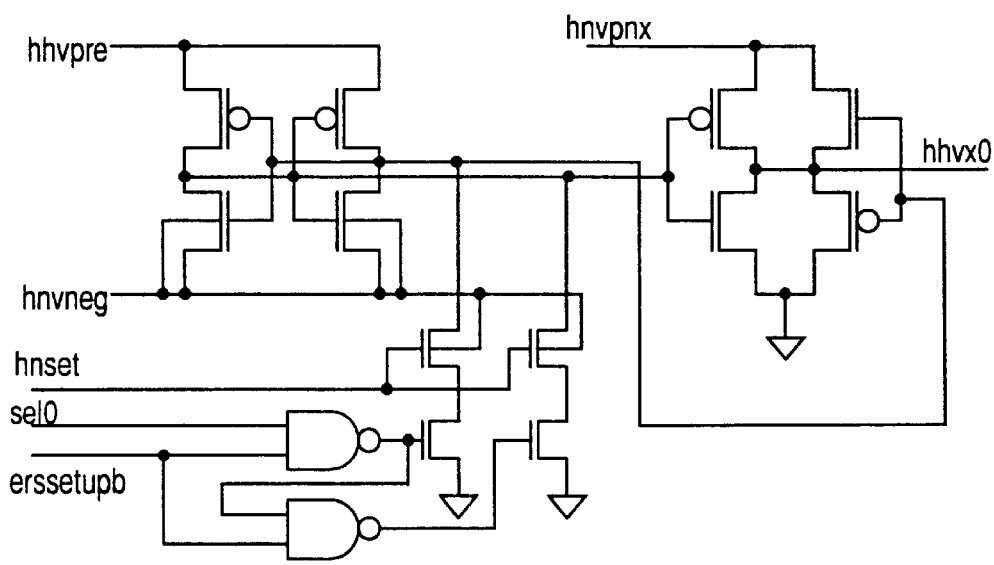
FIG. 14 is a circuit diagram of a selecting voltage circuit in FIG. 12.
Figure 15:
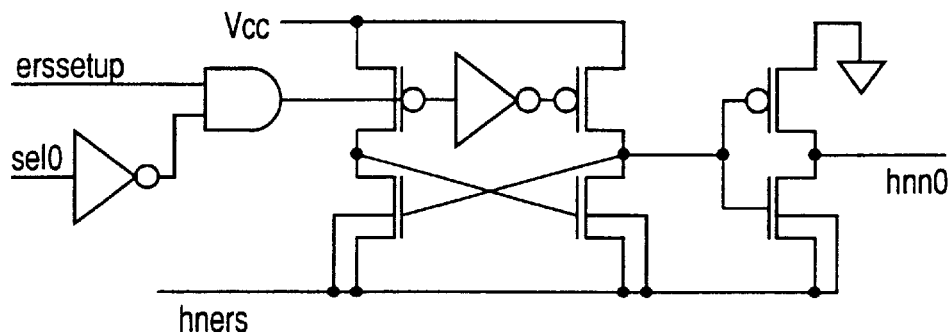
FIG. 15 is a circuit diagram of a non-selecting voltage circuit in FIG. 12.
Figure 16:
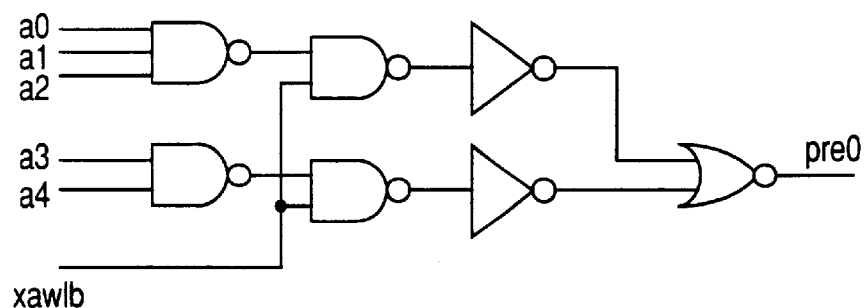
FIG. 16 is a circuit diagram of a predecoder in FIG. 12.

When an output signal pre i of any one of predecoders i of predecoders 0 through 31 comes to have "H" level (selected) by the address signals a0 through a4 for specifying the word line to be subjected to the write operation in all the blocks, the corresponding one word line WL(32k+i) out of 32 word lines that constitute each of the 512 blocks is selected by the operation of the control voltage circuit section 33, the selecting voltage circuit section 34, the non-selecting voltage circuit section 35 and the driver section 32. Then, a voltage of −8 V is simultaneously applied to a total of 512 selected word lines WL. On the other hand, a voltage of 0 V is applied to the non-selected word lines WL other than the selected word lines WL since the output signal pre from the predecoder has "L" level (non-selected). It is to be noted that the control voltage circuits that constitute the control voltage circuit section 33 have the same circuit construction as that of FIG. 13. The selecting voltage circuits that constitute the selecting voltage circuit section 34 have the same circuit construction as that of FIG. 14. The non-selecting voltage circuits that constitute the non-selecting voltage circuit section 35 have the same circuit construction as that of FIG. 15. The predecoders that constitute the predecoder section 36 have the same circuit construction as that of FIG. 16.

With the above-mentioned arrangement, the write voltage can be simultaneously applied to the word lines WL selected one after another from all the blocks. The state in which the word lines WL are selected in this case is schematically shown in FIG. 4. In the ACT type flash memory constructed of the conventional virtual ground type array, the write operation during the test is executed by sequentially selecting the word line WL0 at one end of a block 0 located at one end toward the word line WL16383 at the other end of the block 511 located at the other end, as shown in FIG. 5.

As described above, in the present embodiment, the word lines WL are selected one after another according to a specified regularity from all the blocks in the write operation during the test. For example, when i=0, i.e., when the number i of the predecoder for outputting the output signal pre that comes to have "H" level is "0", the word line WL0, the word line WL32, . . . , and the word line WL32k are selected in the block 0, the block 1 and the block k, respectively, and the write voltage is simultaneously applied. When i=1, i.e., when the level of pre1 is "H", the word line WL1 (block 0), the word line WL33 (block 1), . . . , and the word line WL(32k+1) (block k) are selected, and the write voltage is simultaneously applied. Finally, when i=31, i.e., the level of pre31 is "H", the word line WL31 (block 0), the word line WL63 (block 1), . . . , and the word line WL(32k+31) (block k) are selected, and the write voltage is simultaneously applied.

According to the present invention, it is proper to select one word line from every block, and it is not always required to establish regularity for the selection. However, taking the circuit construction of the practical row decoder circuit (word line drive circuit) into consideration, the word line selection having the above-mentioned regularity allows the circuit construction of the row decoder circuit to be provided more easily.

After the write operation is executed during the test in each memory cell with the selection of one word line WL from all the blocks as described above, a read operation is executed next as follows in order to determine the characteristic of each memory cell. That is, the control signal MBPRG is made to have "L" level in the row decoder circuit 31 shown in FIG. 1. By this operation, the output signal sel of any one block decoder selected by the address signals a5 through a13 comes to have "H" level, and one block is selected. On the other hand, the output signal pre i of the predecoder i that corresponds to the word line WL to which the write voltage has been applied during the test inside the selected block comes to have "H" level by the addresses a0 through a4, and the word line WL to be subjected to the write operation during the test inside the selected block is selected. Then, a voltage of 3 V is applied to the thus selected one word line WL. Concurrently with the above operation, a voltage of 0 V is applied to the other non-selected word lines WL. Thus, the read operation during the test (operation for determining the write characteristic of the memory cell by measuring the threshold voltage of the memory cell) is executed. Subsequently, the selected block is updated by the address signals a5 through a13, and the read (measurement) operation of the word line WL to be subjected to the write operation during the test inside the selected block will be similarly repeated.

In the above case, there is electrical separation between the blocks 1 through 511 by the select transistors Trk as shown in FIG. 3. Therefore, if there is a memory cell that has a negative threshold voltage, then no influence is exerted since the different blocks are electrically separated apart.

Figure 18:
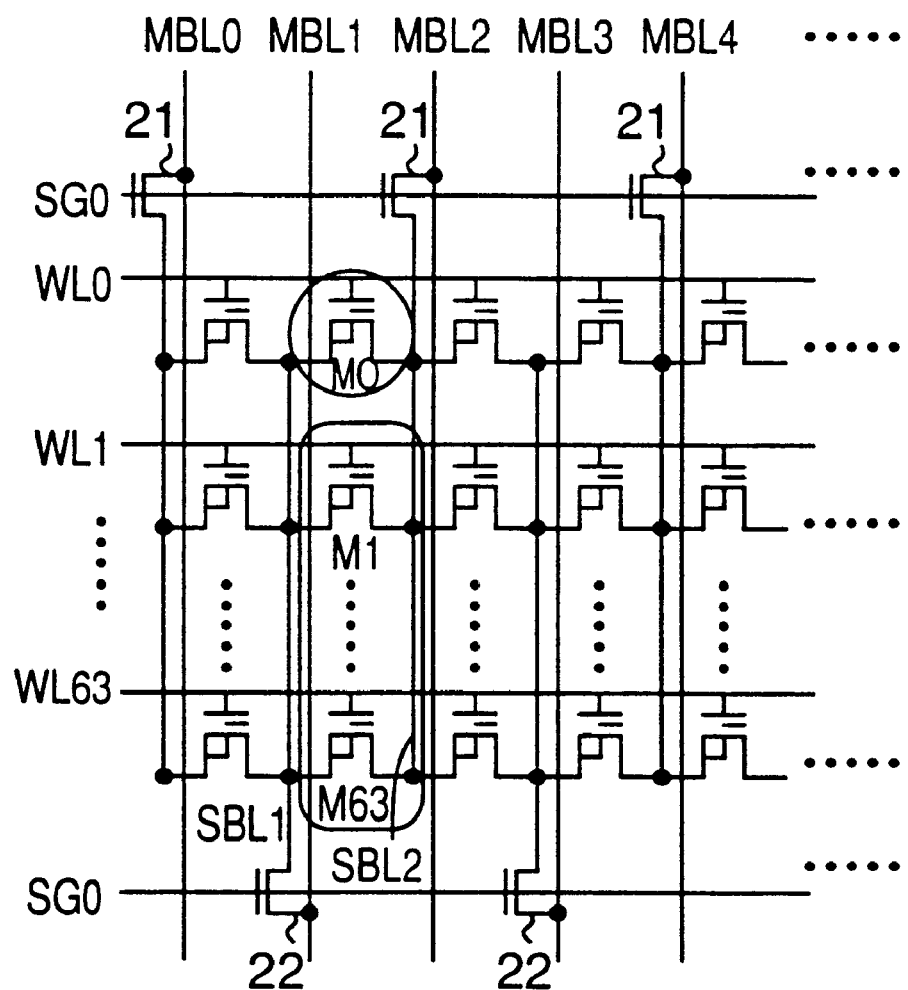
FIG. 18 is an explanatory view of a selecting block in which a memory cell having a negative threshold voltage exists.

In contrast to this, there is exerted influence on the determination of the write characteristic of other memory cells if a memory cell that has a negative threshold voltage exists since an identical block is not internally electrically separated. That is, if there is existing a memory cell in which at least one bit has come to have a negative threshold value (Vt<0 V) inside the selected block, then the memory cell is turned on even when the word line WL has a voltage of 0 V (non-selected state). Therefore, the threshold voltages of other memory cells that share a sub-bit line with the memory cell cannot be measured (see FIG. 18). Accordingly, after the write/read operation on one word line WL of all the blocks is ended, all the word lines WL are erased in a batch to make all the memory cells have a positive threshold voltage (not lower than 4 V), preventing the influence exerted on the test of the next memory cell. It is otherwise acceptable to apply an erase voltage not to all the word lines WL but only to the word line to which the write voltage has been applied through the write operation during the test by the operation of the row decoder circuit 31 similar to the operation of the row decoder circuit 31 in the write operation during the test and set the memory cell in which the threshold voltage has been lowered through the write operation during the test back into the erase state.

Thus, after preventing the influence of the memory cell in which the write operation during the test has been executed on the test of the next memory cell, the next word line WL is selected from all the blocks and subjected to the write operation during the test. It is to be noted that the selection of the word line inside the block is executed by the addresses a0 through a4.

As described above, in the present embodiment, the individual block decoders constituting the block decoder section 37 of the ACT type flash memory are provided with the OR gate 42 that receives the output signal of the select signal generating circuit 41 (corresponding to the conventional block decoder show in FIG. 17) and the control signal MBPRG as the inputs and constructed so as to output the signal sel. Then, in the write operation during the test, the control signal MBPRG is made to have "H" level, and all the blocks are selected regardless of the contents of the address signals a5 through a13. Therefore, by specifying the word line WL to be subjected to the write operation inside all the blocks by the addresses a0 through a4, a total of 512 word lines WL are selected one after another from all of the 512 blocks, and the voltage of −8 V can be applied to these 512 selected word lines WL.

Thus, the write operation is simultaneously executed in the memory cells M whose control gates are connected to the one selected word line WL every block electrically separated by the select transistor Trk.

Therefore, since the number of blocks is 512 when one block is constructed of 32 word lines WL in the case of a 64-Mbit device that has 16384 word lines WL, the write operation can be simultaneously executed on the 512 word lines WL. That is, the write time during the test can be shortened to 1/512.

In the above case, even if there is a memory cell that has a negative threshold voltage inside the memory cell in which the write operation during the test has been executed, the rows of other memory cells in which the write operation during the test has been executed do not exist inside an identical block. That is, the row of the memory cell that has a negative threshold voltage is electrically separated from the rows of other memory cells by the select transistor Trk. Therefore, the bad influence is not exerted on the threshold voltage measurement of other memory cells.

Furthermore, since all the word lines WL are erased in a batch when the test of the word lines WL selected one after another from all the blocks is ended, the bad influence is not exerted on the next test even if there occurs a memory cell that has a negative threshold voltage through the write operation during the test executed this time.

That is, according to the present embodiment, the write test can be executed normally and speedily.

(Second Embodiment)

Figure 6:
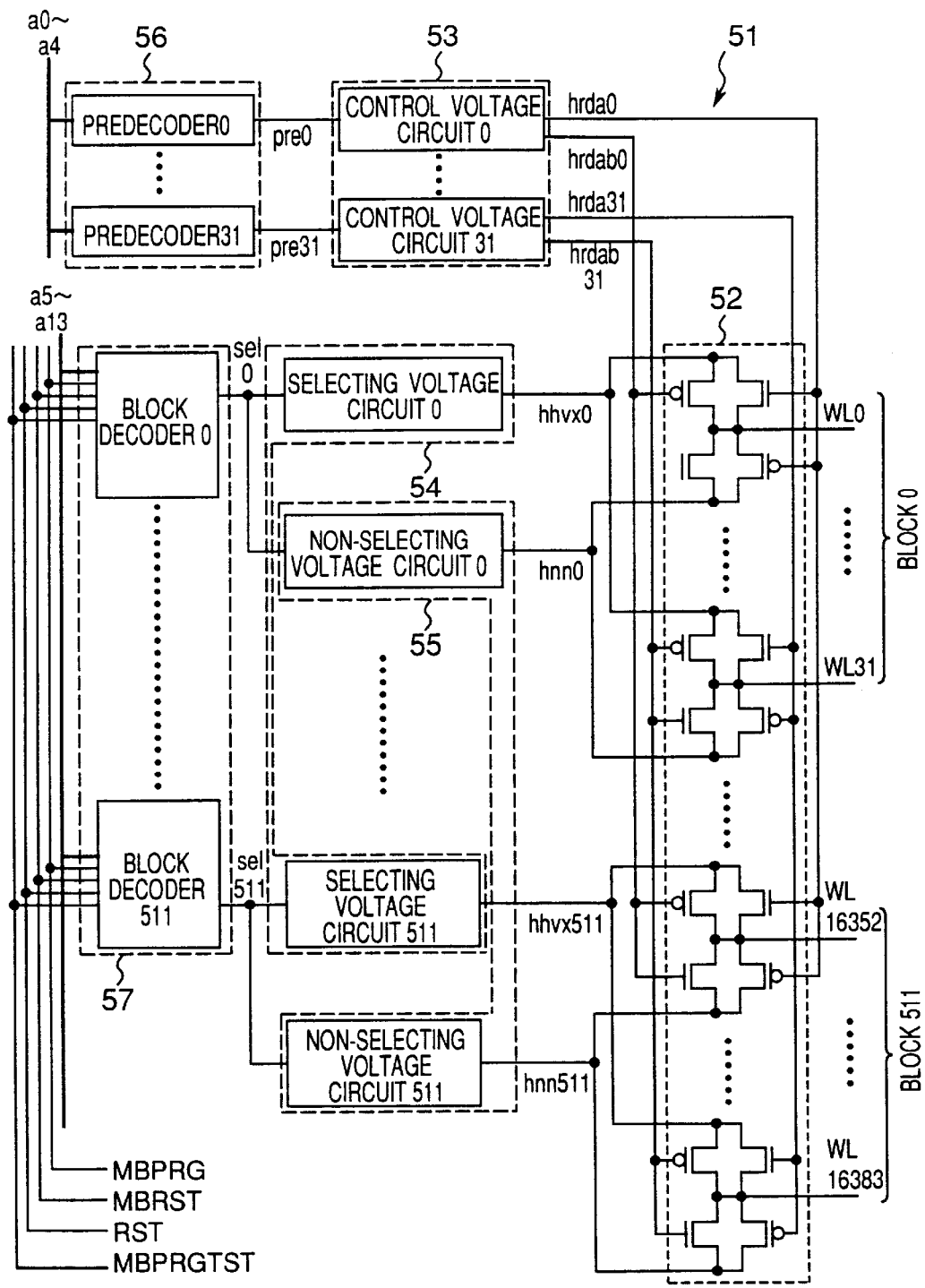
FIG. 6 is a block diagram of a row decoder circuit different from that of FIG. 1.

FIG. 6 is a block diagram of a row decoder circuit applied to the nonvolatile semiconductor storage device of the present embodiment. In the case of the row decoder circuit 51 of the present embodiment, similarly to the case of the row decoder circuit 31 of FIG. 1, the control signal MBPRG is inputted to the individual block decoders that constitute the block decoder 57. It is to be noted that the present embodiment differs from the first embodiment in that a control signal MBRST, a control signal RST and a control signal MBPRGTST are additionally inputted in addition to the control signal MBPRG. It is to be noted that the control voltage circuits that constitute a driver section 52 and a control voltage circuit section 53, the selecting voltage circuits that constitute a selecting voltage circuit section 54, the non-selecting voltage circuits that constitute a non-selecting voltage circuit section 55 and the predecoders that constitute a predecoder section 56 have the same constructions and functions as those of the conventional row decoder circuit 11 shown in FIG. 12.

Figure 7:
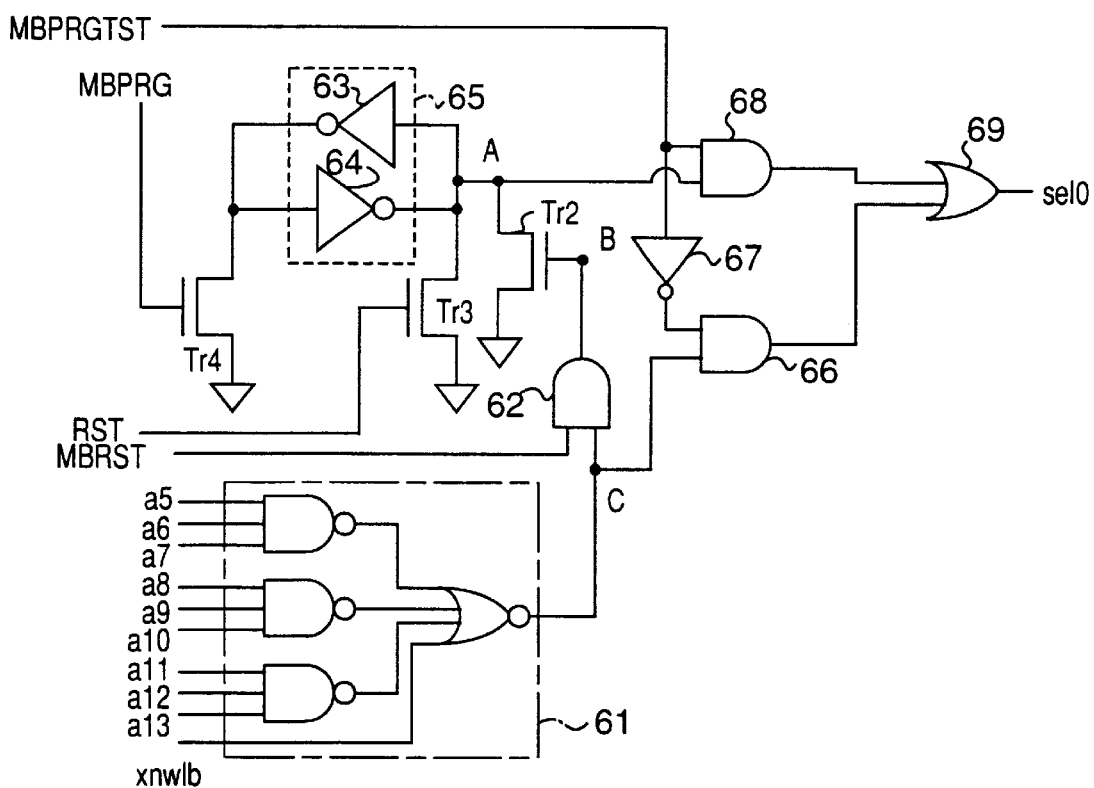
FIG. 7 is a circuit diagram of a block decoder in FIG. 6.
Figure 8:
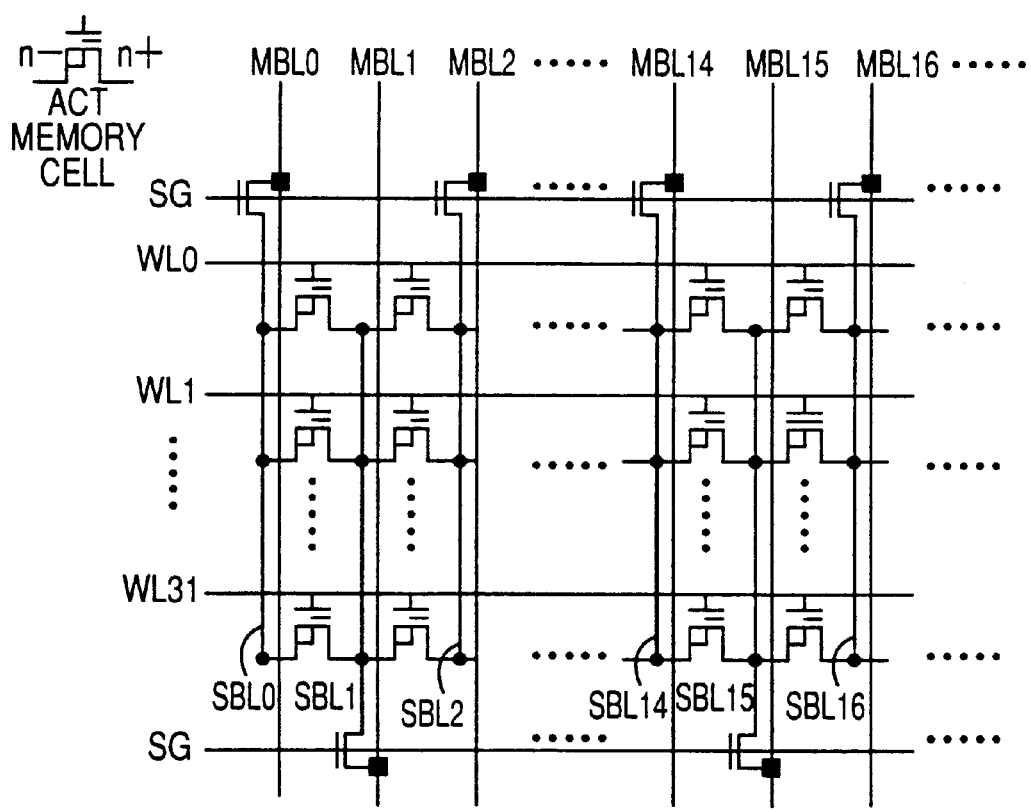
FIG. 8 is a diagram showing the array structure of an ACT type flash memory.
Figure 9:
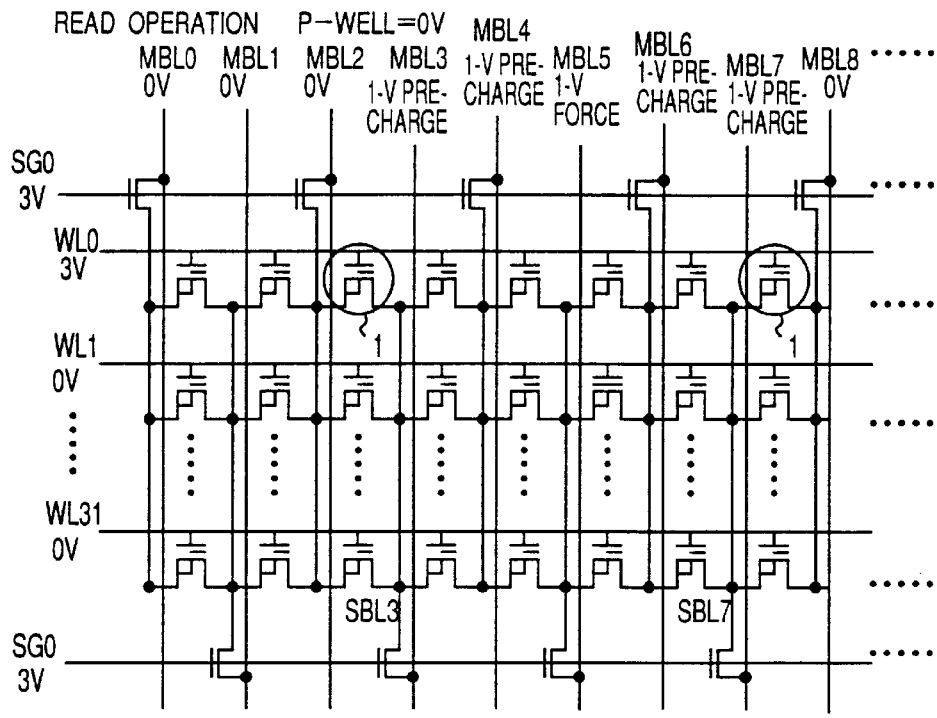
FIG. 9 is an explanatory view of a read operation in the ACT type flash memory shown in FIG. 8.
Figure 10:
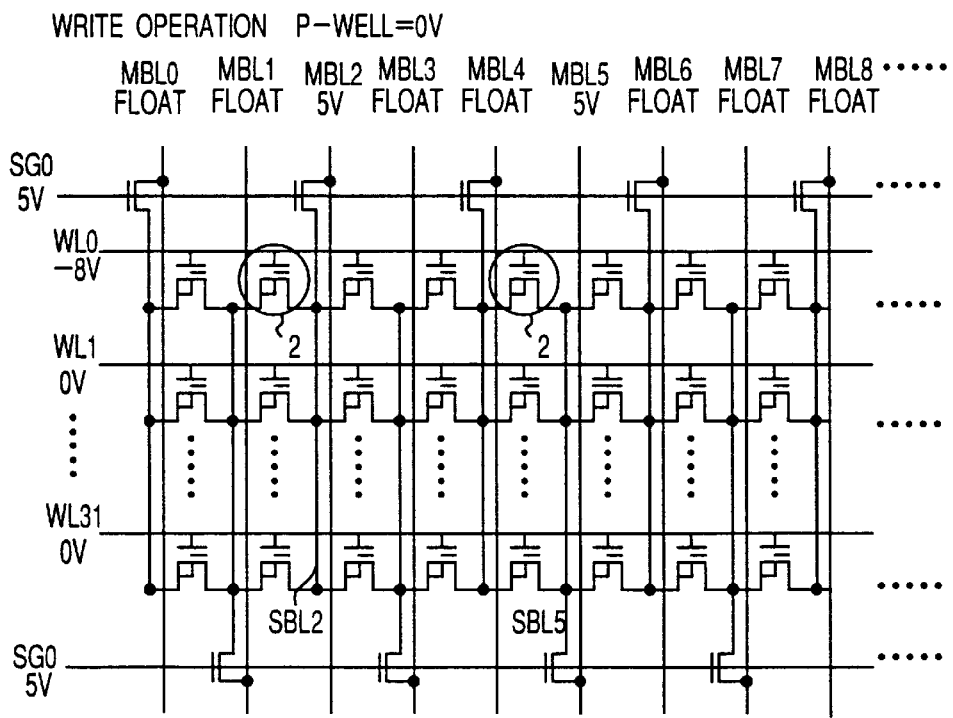
FIG. 10 is an explanatory view of a write operation in the ACT type flash memory shown in FIG. 8.
Figure 11:
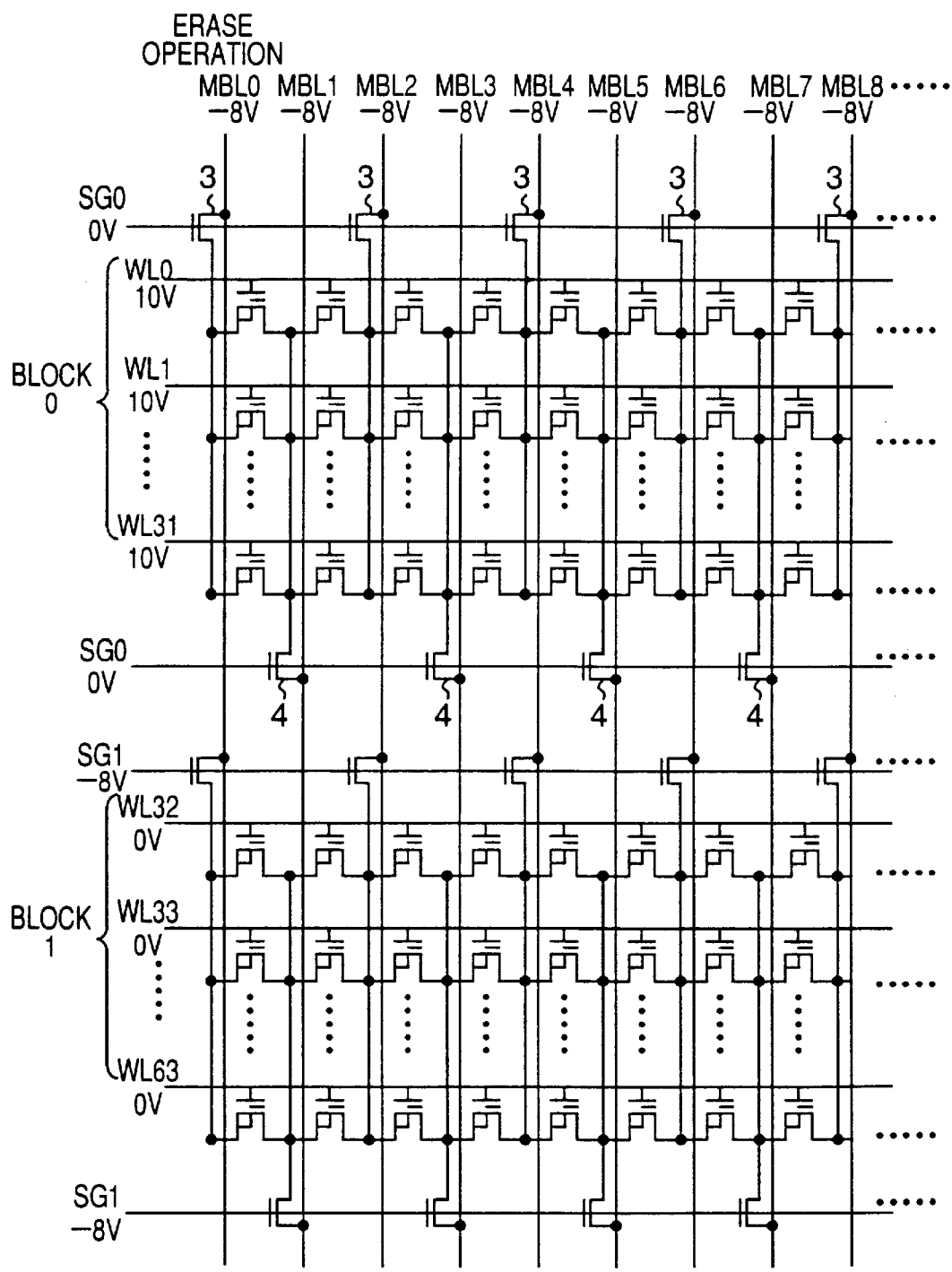
FIG. 11 is an explanatory view of an erase operation in the ACT type flash memory shown in FIG. 8.

FIG. 7 is a circuit diagram of the block decoder 0 that constitutes the block decoder section 57 of the present embodiment. As shown in FIG. 7, the block decoder 0 of the present embodiment has the same circuit construction as that of the conventional block decoder shown in FIG. 17 and includes an AND gate 62 which receives an output signal of a select signal generating circuit 61 for generating a select signal and the control signal MBRST as the inputs. Then, an input terminal of an inverter 63 and an output terminal of an inverter 64 are commonly connected to the drain of a transistor Tr2 whose gate receives the output signal of the AND gate 62 as an input and to the drain of the transistor Tr3 whose gate receives the control signal RST as an input. On the other hand, the drain of a transistor Tr4 whose gate receives the control signal MBPRG as an input is commonly connected to the output terminal of the inverter 63 and the input terminal of the inverter 64.

There is also provided an AND gate 66 which receives the output signal of the select signal generating circuit 61 as an input, and an output signal of an inverter 67 for inverting the level of the control signal MBPRGTST is inputted to the other input terminal of this AND gate 66. Further, there is provided an AND gate 68 whose one input terminal is connected to the drain of the transistor Tr2, and the control signal MBPRGTST is inputted to the other input terminal of this AND gate 68. There is further provided an OR gate 69 that receives the output signal from the AND gate 66 and the output signal from the AND gate 68 as inputs, and a signal se10, which is an input signal to the selecting voltage circuit 0 and the non-selecting voltage circuit 0, is outputted from the OR gate 69.

Then, in FIG. 7, the control signal MBPRGTST is made to have "H" level in the write operation during the test. It is to be noted that this control signal MBPRGTST is a signal for selecting all the blocks, and its level is set to "L" in the read operation during the test, in the verify operation and in the normal operation. In the above-mentioned state, the transistor Tr4 is turned on when the control signal MBPRG comes to have "H" level, and the level of the node A that is the output stage of a latch circuit 65 constructed of the two inverters 63 and 64 is latched into "H" level (note that the level of the control signal RST is once set to "H" level to latch the level of the node A into "L" level in the normal write operation) The control signal MBRST and the control signal RST are preparatorily made to have "L" level. By this operation, the output signal of the AND gate 68 comes to have "H" level, while the output signal se10 comes to have "H" level regardless of the contents of the address signals a5 through a13. In this case, the block decoders 1 through 511 also have the same circuit construction and differ only in, for example, the address signals to be inputted being inverted such as/a5 in order to specify a block position. Accordingly, the output signals sel1 through sel511 similarly come to have "H" level since the commonly inputted control signal MBPRGTST and control signal MBPRG have "H" level.

As described above, also in the present embodiment, regardless of the contents of the address signals a5 through a13 for block selection, all the blocks can be selected by making the output signals se10 through sel511 from the block decoders 0 through 511 have "H" level. That is, in the present embodiment, the all blocks selecting means is constructed of the transistor Tr4, the latch circuit 65, the AND gate 68 and the OR gate 69.

It is to be noted that the control signal MBPRG maintains "H" level in the write operation during the test according to the first embodiment. However, the present embodiment, which has the latch circuit 65 in the block decoder, is able to make the control signal MBPRG once have "H" level and set the signal back to "L" level.

By this operation, the row decoder 51 is to execute the same operation as that of the first embodiment. That is, since the control signal MBPRGTST has "H" level, when the control signal MBPRG is enabled, the latch circuits inside the block decoders 0 through 511 are set with regard to all the blocks 0 through 511, and the signals se10 through selS11 are enabled. As a result, the selected voltage circuits 0 through 511 of all the blocks 0 through 511 are to supply a signal hhvx of "H" level to the driver section 52. Consequently, the write voltage is applied to the one word line WL selected by the select signals hrdai and hrdabi from the control voltage circuit i specified by the address signals a0 through a4 out of 32 word lines WL in all the blocks, and a voltage of 0 V supplied from the non-selected voltage circuit is to be applied to the remaining 31 word lines WL. Thus, the write operation during the test can be simultaneously executed on the word lines WL selected one after another from every block.

After the write operation during the test with the write voltage applied to a total of 512 word lines WL selected one after another from every block is ended, the word lines WL in which the write operation during the test has ended are sequentially selected as follows by the address signals a0 through a4 and the address signals a5 through a13, and the threshold voltage of each memory cell M whose control gate is connected to the selected word line WL is measured. That is, the control signal MBPRGTST is first made to have "L" level, making the output signal of the AND gate 68 have "L" level and making one input signal of the AND gate 66 have "H" level. By this operation, when the output of the select signal generating circuit 61 is made to have "H" level by the address signals a5 through a13, the output signal of the AND gate 66 comes to have "H" level, and the output signal se10 comes to have "H" level. Thus, the blocks are sequentially selected by the address signals a5 through a13. Then, the select transistor Trk of the selected block is turned on, and the word line WL in the selected block is selected by the address signals a0 through a4 to measure the threshold voltage of the memory cell M whose control gate is connected to the selected word line WL. In the above case, even if a memory cell M having a negative threshold value exists, no influence is exerted during the read and verify operations since the blocks are electrically separated apart so long as the blocks are different.

In this case, with regard to the word line WL to which only the memory cell M where the write operation has normally been completed and no further rewrite operation is required is connected, further application of the write voltage will exert an excessive stress on the memory cell M. Therefore, preferably, the write voltage should not be applied to the word line WL.

Accordingly, in the present embodiment, when the threshold voltage of the memory cell M has a specified value (not lower than 0 V and not higher than 2 V) when measuring the threshold voltage of the memory cell M, the control signal MBRST is once made to have "H" level and then set back to "L" level while the measurement memory cell (normal memory cell) M is still selected immediately after the measurement of the threshold voltage (i.e., while the output signal of the select signal generating circuit 61 has "H" level) so as not to further apply the write voltage to the word line WL (referred to as a "normal word line" hereinafter) to which only the control gate of the normal memory cell M is connected.

By the above operation, in FIG. 7, the transistor Tr2 is turned on since the level of the node B comes to have "H" level, and the latch circuit 65 is inverted to latch the node A into "L" level. Therefore, even if the control signal MBPRGTST comes to have "H" level in the subsequent rewrite operation, the output of the AND gate 68 has "L" level. At the same time, the control signal MBPRGTST having "L" level inverted by the inverter 67 is inputted to one terminal of the AND gate 66. As a result, the outputs of the AND gates 66 and 68 come to have "L" level, and the output signal sel of the block decoder still has "L" level. Therefore, the normal word line WL is not selected, and the write voltage is not applied to the word line WL until the end of the rewrite operation during the subsequent test. In the above case, the control signal MBPRGTST has "L" level when the read (measurement) operation during the test on other blocks is executed, and therefore, it is sometimes the case where the block in which the normal word line WL exists is erroneously selected by the address signals a5 through a13. Even in the above case, the voltage (3 V) applied to the normal word line WL is higher than the write voltage (−8 V), and therefore, no excessive stress is applied.

That is, in the present embodiment, the selection preventing means is constructed of the AND gates 66 and 68, the inverter 67 and the transistor Tr2.

The above-mentioned operation will be similarly executed for all the block decoders 0 through 511.

Subsequently, the control signal MBPRGTST is made to have "H" level, and the write voltage specified by the test is applied again in a batch to the word lines WL in which the read (measurement) operation during the test has been ended. Thus, the write voltage is applied again to the write-failure memory cell whose control gate is connected to the word line WL of the block where the latch circuit 65 of the block decoder is not inverted by the control signal MBRST.

When the write operation during the test, the read (measurement) operation and the rewrite operation are ended, the control signal RST is once made to have "H" level. By this operation, the transistor Tr3 in each block decoder is turned on, and therefore, the latch circuit 65, which has not been inverted during the latch circuit inversion by the aforementioned control signal MBRST, is inverted. Thus, the latch circuits 65 of all the block decoders are reliably inverted, and each node A comes to have "L" level so as to be initialized. Subsequently, the level of the control signal RST is set back to "L" level. That is, in the present embodiment, the resetting means is constructed of the transistor Tr3.

As described above, the possible occurrence of influence on the memory cell test to be subsequently executed is prevented by erasing in a batch all the word lines WL so as to make all the memory cells have a positive threshold voltage (4 V or higher) after ending the write and read operations of one word line WL for all the blocks. Otherwise, it is also acceptable to set the memory cell in which the threshold voltage has been lowered through the write operation during the test back into the erase state by applying an erase voltage not to all the word lines WL but only to the word line to which the write voltage has been applied through the write operation during the test by the operation of the row decoder circuit 51 similar to the operation of the row decoder circuit 51 in the write operation during the test.

Subsequently, the program flow proceeds to the write test on the next one word line WL of every block by changing the contents of the address signals a0 through a4. Then, the level of the control signal MBPRGTST is first made to have "H" level, and the control signal MBPRG is once made to have "H" level. Then, the write operation during the test is executed in a batch according to the aforementioned procedure. Thereafter, the control signal MBPRGTST is made to have "L" level, and a reading (measurement) operation based on the address signals a5 through a13 is executed according to the aforementioned procedure. In the above case, when the memory cells M of one line relevant to one word line WL of a block are all normal memory cells M as the result of execution of the read (measurement) operation of the block, the control signal MBRST is once made to have "H" level to reset the latch circuits 65 of the block decoder relevant to the normal memory cells M. Thus, the block is prevented from being selected even when the control signal MBPRGTST for batch selection is made to have "H" level during the rewrite operation. Thereafter, the rewrite operation is executed, and when the write operation during the test, the read (measurement) operation and the rewrite operation are ended, the control signal RST is once made to have "H" level to reset the latch circuits 65 of all the block decoders.

As described above, in the present embodiment, the individual block decoders that constitute the block decoder section 57 of the ACT type flash memory are constructed so as to output the signal sel by providing the latch circuit 65 for latching the "H" level of the control signal MBPRG, the AND gate 66 to which the output signal of the select signal generating circuit (corresponding to the conventional block decoder shown in FIG. 17) 61 and the inverted signal of the control signal MBPRGTEST are inputted, the AND gate 68 to which the output signal of the latch circuit 65 and the control signal MBPRGTEST are inputted and the OR gate 69 to which the outputs of the AND gate 66 and the AND gate 68 are inputted. Then, by first making the control signal MBPRGTST have "H" level and thereafter making the control signal MBPRG once have "H" level in the write operation during the test, all the blocks are selected regardless of the contents of the address signals a5 through a13. Therefore, similarly to the case of the first embodiment, the write voltage can be simultaneously applied to the word lines WL selected one after another from all the blocks that are electrically separated by the select transistors Trk.

Furthermore, the block decoders of the present embodiment are each provided with the first reset circuit (AND gate 62 and transistor Tr2) for resetting by the control signal MBRST the latched contents of the latch circuit 65 of the block decoder currently selected by the address signals a5 through a13. Therefore, when all the memory cells M relevant to the selected word line WL of the selected block decoder through the measurement during the test are normal, the latched contents of the latch circuit 65 of the selected block decoder can be reset. As a result, since the outputs of both the AND gates 66 and 68 come to have "L" level when the control signal MBPRGTST comes to have "H" level in the subsequent rewrite operation, and therefore, the block decoder is not selected during the rewrite operation until the latch circuit 65 is set by the control signal MBPRG. Therefore, the excessive stress can be prevented from being applied to the normal memory cells M.

Furthermore, the block decoders of the present embodiment are each provided with the second reset circuit (transistor Tr3) for resetting the latched contents of the latch circuit 65 by the control signal RST regardless of the selection/non-selection. Therefore, the latched contents of the latch circuits 65 of all the control gates can be reset prior to the selection of each block, and the block selection can be accurately achieved in the erase operation or a similar operation.

The aforementioned embodiments have each been described on the basis of the construction in which one word line of every block is subjected to simultaneous selection. However, if it is impossible to execute the simultaneous selection of one word line of every block for the reasons of restriction or the like of the write current, then it is acceptable to prepare a plurality of control signals MBPRG and select one word line WL per block. For example, by preparing a plurality of control signals MBPRG1, MBPRG2 and MBPRG3, inputting the control signal MBPRG1 to the block decoder 1, inputting the control signal MBPRG2 to the block decoder 2 and inputting the control signal MBPRG3 to the block decoder 3, it is permitted to execute the write operation during the test of the word line of one block. Moreover, it can be easily achieved to select the block 1 and the block 3 by making, for example, the control signal MBPRG1 and the control signal MBPRG3 have "H" level, or select the blocks 1, 2 and 3 by making the control signals MBPRG1, MBPRG2 and MBPRG3 have "H" level or simultaneously arbitrarily execute the write operation during the test of the word line of a random block.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile semiconductor storage device including floating gate field-effect transistors that are provided with a control gate, a floating gate, a drain and a source, able to electrically write and erase information and arranged in a matrix form on a substrate or a well and including a plurality of row lines connected to the control gates of the floating gate field-effect transistors arranged in a direction of row, the device comprising:

a block switching means for dividing the row lines into blocks every several lines and connecting a plurality of first column lines connected to the drains and sources of the floating gate field-effect transistors arranged in a direction of column in each block to a second column line arranged commonly to all the blocks;

a block selecting means for selecting any one of the plurality of blocks based at least in part upon address signals received by a block decoder section for selecting one of the plurality of blocks;

a row line selecting means for selecting any one of the plurality of row lines inside the selected block; and an all blocks selecting means, provided for the block selecting means, for simultaneously selecting all the blocks on the basis of at least a first control signal regardless of contents of the address signals.

2. A nonvolatile semiconductor storage device as claimed in claim 1, comprising:

a selection preventing means, provided for the block selecting means, for preventing a subsequent selecting operation of a block currently selected by an address signal on the basis of a second control signal.

3. A nonvolatile semiconductor storage device as claimed in claim 1, comprising:

a resetting means, provided for the block selecting means, for setting the state of selection by the all blocks selecting means back into an initial state on the basis of a third control signal.

4. The device of claim 1, wherein the all blocks selecting means comprises a gate circuit that receives both: (a) the first control signal, and (b) a select signal from a select signal generating circuit of block decoding means that is based upon the address signals, and outputs the first control signal antecedently to the select signal.

5. The device of claim 1, wherein the all blocks selecting means comprises (i) a latch circuit that selectively holds data in dependence on the first control signal and other control signals inputted, respectively, and (ii) a gate circuit that receives a second control signal, a select signal from a select signal generating circuit and an output signal from the latch circuit, and selectively outputs the select signal or the output signal from the latch circuit depending upon the second control signal.

6. A nonvolatile semiconductor storage device including floating gate field-effect transistors that are provided with a control gate, a floating gate, a drain and a source, able to electrically write and erase information and arranged in a matrix form on a substrate or a well and including a plurality of row lines connected to the control gates of the floating gate field-effect transistors arranged in a direction of row, the device comprising:

a block switching means dividing the row lines into blocks every several lines and connecting a plurality of first column lines connected to the drains and sources of the floating gate field-effect transistors arranged in a direction of column in each block to a second column line arranged commonly to all the blocks;

a block decoding means including a plurality of block decoders for selecting any one of the plurality of blocks based at least in part upon address signals received by the block decoding means;

a row line selecting circuit for selecting any one of the plurality of row lines inside the selected block; and an all blocks selecting means, operatively associated with the block decoding means, for selecting all the blocks on the basis of at least a first control signal regardless of contents of the address signals.

7. The device of claim 6, wherein the all blocks selecting circuit comprises a gate circuit that receives both: (a) the first control signal, and (b) a select signal from a select signal generating circuit of the block decoding means that is based upon the address signals and outputs the first control signal antecedently to the select signal.

8. The device of claim 6, wherein the all blocks selecting means comprises (i) a latch circuit that selectively holds data in dependence on the first control signal and other control signals inputted, respectively, and (ii) a gate circuit that receives a second control signal, a select signal from a select signal generating circuit and an output signal from the latch circuit, and selectively outputs the select signal or the output signal from the latch circuit depending upon the second control signal.

9. The device of claim 6, wherein the all blocks selecting means simultaneously selects all blocks on the basis of at least the first control signal regardless of contents of the address signals.

10. The device of claim 4, wherein the gate circuit is an OR gate.

11. The device of claim 7, wherein the gate circuit comprises an OR gate.

12. A nonvolatile semiconductor storage device including floating gate field-effect transistors that are provided with a control gate, a floating gate, a drain and a source, able to electrically write and erase information and arranged in a matrix form on a substrate or a well and including a plurality of row lines connected to the control gates of the floating gate field-effect transistors arranged in a direction of row, the device comprising:

a block switching circuit dividing the row lines into blocks every several lines and connecting a plurality of first column lines connected to the drains and sources of the floating gate field-effect transistors arranged in a direction of column in each block to a second column line arranged commonly to all the blocks;

a block decoding section including a plurality of block decoders for selecting any one of the plurality of blocks based at least in part upon address signals received by the block decoder section;

a row line selecting circuit for selecting any one of the plurality of row lines inside the selected block; and an all blocks selecting circuit, operatively associated with the block decoding section, for selecting all the blocks on the basis of at least a first control signal regardless of contents of the address signals.

13. The device of claim 12, wherein the all blocks selecting circuit comprises an OR gate that receives both: (a) the first control signal, and (b) a select signal from a select signal generating circuit of the block decoder section that is based upon the address signals.

* * * * *